(12) United States Patent
Tanifuji et al.

(10) Patent No.: US 8,298,723 B2
(45) Date of Patent: Oct. 30, 2012

(54) METAL SEPARATOR FOR FUEL CELL AND MANUFACTURING METHOD THEREOF

(75) Inventors: Shinichi Tanifuji, Kobe (JP); Hirotaka Ito, Kobe (JP); Toshiki Sato, Kobe (JP); Jun Suzuki, Kobe (JP); Yoshinori Ito, Kobe (JP); Jun Hisamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 489 days.

(21) Appl. No.: 12/594,825

(22) PCT Filed: Mar. 5, 2008

(86) PCT No.: PCT/JP2008/053998
§ 371 (c)(1),
(2), (4) Date: Oct. 6, 2009

(87) PCT Pub. No.: WO2008/126525
PCT Pub. Date: Oct. 23, 2008

(65) Prior Publication Data
US 2010/0119913 A1    May 13, 2010

(30) Foreign Application Priority Data
Apr. 9, 2007    (JP) .................................. 2007-102053

(51) Int. Cl.
*H01M 8/04* (2006.01)
(52) U.S. Cl. ........ 429/514; 429/518; 429/517; 429/519; 429/522
(58) Field of Classification Search .................. 429/514, 429/518, 522, 517, 519; 204/192.1, 192.12, 204/192.15, 192.17; 427/115, 123, 124, 427/125, 126.1, 528
See application file for complete search history.

(56) References Cited

U.S. PATENT DOCUMENTS
2003/0068523 A1    4/2003 Kaneta et al.
(Continued)

FOREIGN PATENT DOCUMENTS
CN    1505181 A    6/2004
(Continued)

OTHER PUBLICATIONS
Office Action issued Aug. 17, 2011 in Chinese Patent Application No. 200880009635.0 (with English translation).
(Continued)

*Primary Examiner* — Jennifer Michener
*Assistant Examiner* — Heng Chan
(74) *Attorney, Agent, or Firm* — Oblon, Spivak, McClelland, Maier & Neustadt, L.L.P.

(57) ABSTRACT

A metal separator 1 for a fuel cell according to the invention is a metal separator for a fuel cell manufactured by using a metal substrate 2 with a flat surface, or with concave gas flow paths formed on at least a part of the surface. The metal separator 1 includes an acid-resistant metal film 3 formed over the surface of the metal substrate 2, and containing one or more kinds of non-noble metals selected from the group comprised of Zr, Nb, and Ta, and a conductive alloy film 4 formed over the acid-resistant metal film 3, and containing one or more kinds of noble metals selected from the group comprised of Au and Pt, and one or more kinds of non-noble metals selected from the group comprised of Zr, Nb, and Ta. A method for manufacturing the metal separator for a fuel cell according to the invention includes a step S1 of depositing an acid-resistant metal film, and a step S2 of depositing a conductive alloy film. With this structure, the invention provides the metal separator for a fuel cell with an excellent acid resistance and a low contact resistance, and a manufacturing method thereof.

20 Claims, 4 Drawing Sheets

U.S. PATENT DOCUMENTS

| | | |
|---|---|---|
| 2004/0170881 A1 | 9/2004 | Nakata |
| 2006/0019142 A1* | 1/2006 | Abd Elhamid et al. ......... 429/34 |
| 2008/0138691 A1 | 6/2008 | Kikui |

FOREIGN PATENT DOCUMENTS

| | | |
|---|---|---|
| CN | 1797814 A | 7/2006 |
| EP | 1 848 054 A1 | 10/2007 |
| JP | 2 247393 | 10/1990 |
| JP | 6 111828 | 4/1994 |
| JP | 10228914 | 8/1998 |
| JP | 2911102 | 4/1999 |
| JP | 2001 93538 | 4/2001 |
| JP | 2002 367434 | 12/2002 |
| JP | 2004 185998 | 7/2004 |
| JP | 2007 5120 | 1/2007 |
| WO | 2006 082734 | 8/2006 |

OTHER PUBLICATIONS

U.S. Appl. No. 12/615,377, filed Nov. 10, 2009, Ito, et al.
U.S. Appl. No. 12/709,935, filed Feb. 22, 2010, Sato et al.
Extended European Search Report issued Apr. 12, 2012 in patent application No. 08721418.5.

* cited by examiner

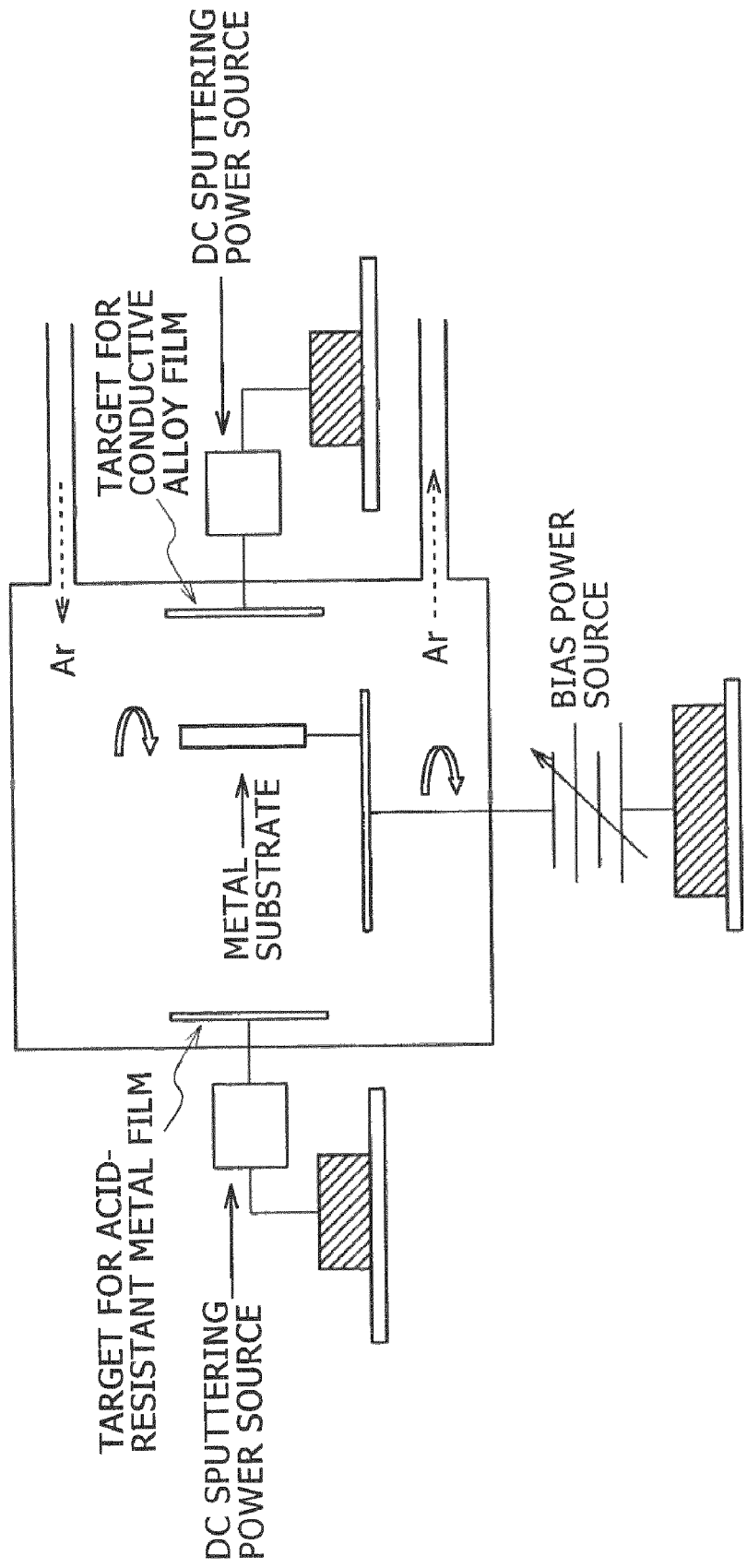
F I G . 4

US 8,298,723 B2

METAL SEPARATOR FOR FUEL CELL AND MANUFACTURING METHOD THEREOF

CROSS REFERENCE TO RELATED APPLICATIONS

The present application is the national stage of international application PCT/JP2008/053998, filed on Mar. 5, 2008, and claims the benefit of the filing date of Japanese Application No. 2007-102053, filed on Apr. 9, 2007.

TECHNICAL FIELD

The present invention relates to a metal separator for a polymer electrolyte fuel cell used in, for example, portable devices, such as a cellular phone or a personal computer, a fuel cell for domestic use, a fuel cell vehicle, or the like, and to a manufacturing method thereof.

BACKGROUND ART

A polymer electrolyte fuel cell is constructed by sandwiching a solid polymer electrolyte membrane between an anode electrode and a cathode electrode to form a single cell, and by stacking the single cells up via electrodes called as a separator (or bipolar plate).

Materials for the separator for the fuel cell are required to have properties, including a low level of contact resistance (which corresponds to a voltage drop caused due to an interface phenomenon between the electrode and the surface of the separator), and maintenance of the low level of contact resistance for a long time during use as the separator. In this point, the use of metal material, such as an aluminum alloy, a stainless steel, a nickel alloy, or a titanium alloy, has hitherto been studied from the viewpoint of the above properties together with workability and strength.

Since the inside of the fuel cell is positioned in an acid corrosion environment, the material used for the separator is required to have enough acid resistance to maintain the low contact resistance for a long time even in the acid environment.

Metal material, such as a stainless steel or titanium alloy, exhibits good corrosion resistance by having a passivation film formed on its surface. Thus, such metal has been studied to be used as a material for separators for fuel cells. The passivation film, however, has a large contact resistance (electric resistance). When the metal, such as the stainless steel or titanium alloy, is used in the fuel cell separator as it is, the passivation film formed on the surface of the metal under the acid environment tends to drastically degrade electrical conductivity of the cell.

Thus, some techniques are proposed for suppressing an increase in contact resistance to maintain the electrical conductivity.

For example, Patent Document 1 has proposed a separator including a substrate made of a stainless steel, titanium, or the like, and an Au plating film attached to the surface of the substrate in a thickness of 10 to 60 nm.

Patent Document 2 has proposed a separator including an acid-resistant metal film formed using Ta or the like on the surface of a substrate made of stainless steel, and a noble metal film formed thereon.

Further, Patent Document 3 has proposed a metal separator including an oxide film included in a metal substrate itself, and a conductive thin film made of a metal, noble metal, or carbon as an outermost layer. Another metal separator has been proposed in which an intermediate layer made of Ta, Zr, Nb, or the like is formed between the oxide film and the conductive thin film so as to improve adhesion (adhesive strength).

[Patent Document 1]
  Japanese Unexamined Patent Publication No. Hei 10 (1998)-228914.
[Patent Document 2]
  Japanese Unexamined Patent Publication No. 2001-93538.
[Patent Document 3]
  Japanese Unexamined Patent Publication No. 2004-185998.

DISCLOSURE OF THE INVENTION

Problems to be Solved by the Invention

However, since the metal conventionally studied, such as the stainless steel or titanium alloy, has a passivation film formed on its surface in the acid environment as described above, the electrical conductivity of the metal tends to be drastically degraded. Thus, there is a problem that such a metal cannot maintain a low contact resistance for a long time in use as a separator even when the contact resistance is low on an initial stage of use. The contact resistance increases over time, which disadvantageously leads to a loss in current. There is another problem that metal ions eluted from the material degrade the quality of an electrolyte membrane when the metal is corroded.

In the technique described in Patent Document 1, an Au plating layer is peeled off when being exposed to the strict acid environment in the fuel cell, which may increase the contact resistance of the substrate, resulting in degraded performance of the fuel cell.

In the technique described in Patent Document 2, since any one of Ta, Zr, and Nb used in the acid-resistant metal film is a metal having a high melting point exceeding 1800° C., the acid-resistant metal film formed using this metal by a normal sputtering method has pinholes formed therein. A noble metal film to be formed of Au or the like on the acid-resistant metal film is deposited with the pinholes maintained in the acid-resistant metal film, which may cause metal material of the substrate to be eluted from the pinholes in the acid environment. The acid-resistant metal film made of Ta or the like and the noble metal film made of Au or the like have so poor adhesion that these films are easily peeled off from each other even in a tape-peeling test. Thus, the use of such films as a separator of the fuel cell peels off the noble metal film of Au or the like by friction or the like generated between the separator and a gas diffusion layer (carbon cloth) due to vibration or the like in use, which may degrade the performance of the fuel cell.

In the technique described in Patent Document 3, when the intermediate layer is formed on the oxide film, the poor adhesion therebetween may cause the conductive thin film to be peeled off. When a metal material having a high melting point, such as Ta, Zr, or Nb, is used to form the intermediate layer between the oxide film and the conductive thin film, pinholes may be formed in the intermediate layer, from which a metal material of the substrate may be eluted, like the case disclosed in Patent Document 2. The conductive thin film made of noble metal may be peeled because of poor adhesion.

The invention has been made in view of the above problems, and it is an object of the invention to provide a metal separator for a fuel cell with excellent acid resistance and a low contact resistance, and a manufacturing method thereof.

In order to solve the forgoing problems, a metal separator for a fuel cell according to the invention is a metal separator for a fuel cell manufactured using a metal substrate with a flat surface, or with a concave gas flow path formed on at least a part of the surface. The metal separator includes an acid-resistant metal film formed over the surface of the metal substrate, and containing one or more kinds of non-noble metals selected from the group comprised of Zr, Nb, and Ta, and a conductive alloy film formed over the acid-resistant metal film, and containing one or more kinds of noble metals selected from the group comprised of Au and Pt, and one or more kinds of non-noble metals selected from the group comprised of Zr, Nb, and Ta.

Thus, the metal separator for a fuel cell according to the invention includes the acid-resistant metal film with excellent acid resistance formed on the surface of the metal substrate, and containing one or more kinds of non-noble metals selected from the group comprised of Zr, Nb, and Ta, and thus can prevent elution of metal from the metal substrate. Such a metal separator for a fuel cell further includes the conductive alloy film formed on the acid-resistant metal film. The conductive alloy film contains the above-mentioned non-noble metal and one or more kinds of noble metals selected from the group comprised of Au and Pt which are superior in acid resistance and do not form an oxide film under an oxidizing environment. Thus, the metal separator has the excellent acid resistance, while improving adhesion between the acid-resistant metal film and the conductive alloy film, thereby reducing the contact resistance.

In the metal separator for a fuel cell in the invention, the non-noble metal content of the conductive alloy film is preferably 5 to 65 atomic %.

Thus, limitation of the non-noble metal content of the conductive alloy film within a specific composition range can further enhance the adhesion between the acid-resistant metal film and the conductive alloy film. This can lessen the possibility of peeling of the conductive alloy film off from the acid-resistant metal film due to friction or the like, and can further reduce the contact resistance.

In the metal separator for a fuel cell in the invention, the conductive alloy film preferably has a thickness of 2 nm or more.

Thus, increasing the thickness of the conductive alloy film to a level more than a specific thickness can more securely reduce the contact resistance, while having the excellent acid resistance.

In the metal separator for a fuel cell in the invention, the acid-resistant metal film preferably has a thickness of 5 nm or more.

Thus, increasing the thickness of the acid-resistant metal film to a level more than a specific thickness surely prevents the formation of pinholes, and makes it difficult for the metal substrate to be exposed, which can prevent elution of the metal from the metal substrate. That is, the metal separator of the invention can include the more excellent acid resistance.

In the metal separator for a fuel cell in the invention, the metal substrate is preferably made of a metal material selected from the group consisting of pure titanium, a titanium alloy, a stainless steel, pure aluminum, an aluminum alloy, pure copper, and a copper alloy.

With this arrangement, the metal separator for a fuel cell with the excellent acid resistance and low contact resistance can be provided which is made of pure titanium, a titanium alloy, a stainless steel, pure aluminum, an aluminum alloy, pure copper, or a copper alloy.

A method for manufacturing a metal separator for a fuel cell according to the invention is to manufacture the metal separator for a fuel cell using a metal substrate with a flat surface, or with a concave gas flow path formed on at least a part of the surface. The method includes the steps of: depositing an acid-resistant metal film over a surface of the metal substrate by a PVD method, the acid-resistant metal film containing one or more kinds of non-noble metals selected from the group comprised of Zr, Nb, and Ta; and depositing a conductive alloy film over the acid-resistant metal film by the PVD method, the conductive alloy film containing one or more kinds of noble metals selected from the group comprised of Au and Pt, and one or more kinds of non-noble metals selected from the group comprised of Zr, Nb, and Ta. In the step of depositing the acid-resistant metal film, the acid-resistant metal film is deposited on the metal substrate by applying a voltage thereto, while heating the metal substrate.

In this way, in the step of depositing the acid-resistant metal film, a voltage is applied to the metal substrate, while heating the metal substrate, so that the dense acid-resistant metal film can be deposited on the metal substrate thereby to prevent elution of the metal from the metal substrate. Further, the metal separator for a fuel cell can be provided with the excellent acid resistance by the deposition of the conductive alloy film on the acid-resistant metal film, and with the low contact resistance by improving the adhesion between the acid-resistant metal film and the conductive alloy film.

In the manufacturing method of the metal separator for a fuel cell according to the invention, preferably, the heating condition of the metal substrate in the step of depositing the acid-resistant metal film is a temperature of 50° C. or more, and the voltage application condition to the metal substrate is a voltage of $-50$ V or less.

In the step of depositing the acid-resistant metal film in this way, the restriction of the heating condition and voltage application condition of the metal substrate suppresses the formation of pinholes in the acid-resistant metal film, and thus can provide the metal film with good acid resistance, which can manufacture the metal separator for a fuel cell which prevents the elution of metal from the metal substrate.

In the manufacturing method of the metal separator for a fuel cell according to the invention, the deposition is preferably performed until the thickness of the conductive alloy film is equal to or more than 2 nm in the step of depositing the conductive alloy film.

Thus, increasing the thickness of the conductive alloy film to a level more than the specific thickness can manufacture the metal separator for a fuel cell with the low contact resistance and excellent acid resistance.

In the manufacturing method of the metal separator for a fuel cell according to the invention, in the step of depositing the acid-resistant metal film, the deposition is preferably performed until the thickness of the acid-resistant metal film is equal to or more than 5 nm.

Thus, increasing the thickness of the acid-resistant metal film to a level more than the specific thickness can prevent the formation of pinholes, and can make it difficult for the metal substrate to be exposed, thereby manufacturing the metal separator for a fuel cell with more excellent acid resistance.

In the manufacturing method of the metal separator for a fuel cell according to the invention, the PVD method is preferably an ion plating method or a sputtering method.

When the film formation step or deposition step is performed using the ion plating method or sputtering method in this way, the plasma generated, that is, ionized gas can generate positively-ionized particles (parts of deposited particles or argon particles) around the substrate. A negative voltage is applied to the substrate to generate a coulomb force, which causes the ionized particles to collide with the substrate. The kinetic energy of the ionized particles is given to the substrate as a thermal energy to activate the surface diffusion of deposited particles on the surface of the substrate, which enables the deposition of the dense acid-resistant metal film.

In the manufacturing method of the metal separator for a fuel cell according to the invention, the metal substrate is preferably a metal material selected from the group comprised of pure titanium, a titanium alloy, a stainless steel, pure aluminum, an aluminum alloy, pure copper, and a copper alloy.

Thus, the metal separator for a fuel cell can be manufactured which is made of pure titanium, a titanium alloy, a stainless steel, pure aluminum, an aluminum alloy, pure copper, or a copper alloy with the excellent acid resistance and low contact resistance.

Effect of the Invention

The metal separator for a fuel cell according to the invention can have the excellent acid resistance, and can reduce the contact resistance. According to the manufacturing method of the metal separator for a fuel cell in the invention, the metal separator for a fuel cell with the excellent acid resistance and low contact resistance can be manufactured.

BRIEF DESCRIPTION OF DRAWINGS

FIG. 4 is an explanatory diagram showing a structure of deposition equipment.

Figure 1:
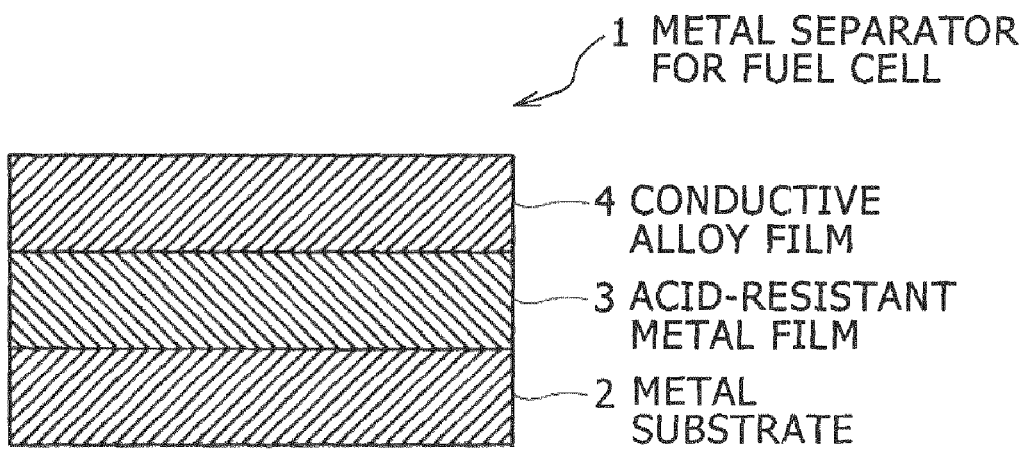
FIG. 1 is a sectional view of a metal separator for a fuel cell according to the invention.

DESCRIPTION OF REFERENCE NUMERALS 1 metal separator for a fuel cell
2 metal substrate
3 acid-resistant metal film
4 conductive alloy film
S1 step of depositing an acid-resistant metal film
S2 step of depositing a conductive alloy film

BEST MODE FOR CARRYING OUT THE INVENTION

Now, a metal separator for a fuel cell and a manufacturing method thereof according to the invention will be described below in detail with reference to FIG. 1. FIG. 1 is a sectional view of the metal separator for a fuel cell according to the invention.

As shown in FIG. 1, a metal separator 1 for a fuel cell according to the invention is a metal separator for a fuel cell manufactured by using a metal substrate 2 with a flat surface, or with concave gas flow paths (not shown) formed on at least a part of the surface. The separator 1 has an acid-resistant metal film 3 and a conductive alloy film 4 over one surface of the metal substrate 2.

A metal material selected from the group consisting of pure titanium, a titanium alloy, a stainless steel, pure aluminum, an aluminum alloy, pure copper, and a copper alloy is suitable for use in the metal substrate 2 because of excellent electrical conductivity. Specifically, a substrate made of any one of pure titanium plates of first to fourth types defined in JIS H 4600, a Ti alloy, such as Ti—Al, Ti—Ta, Ti-6Al-4V, or Ti—Pd, or stainless material, such as SUS304 or SUS316, or a substrate made of pure aluminum, an aluminum alloy, pure copper, or a copper alloy can be used.

From the viewpoint of costs, pure aluminum, aluminum alloy, or stainless steel is preferably used. From the viewpoint of acid resistance, pure titanium or titanium alloy is preferably used. However, metal material for the metal substrate 2 which can be used in the metal separator for a fuel cell of the invention is not limited thereto. It is apparent that any other metal material which can be used as a metal separator in a fuel cell can be used.

The metal substrate 2 may have concave gas flow paths previously formed on at least part of its surface before depositing the acid-resistant metal film 3 and the conductive alloy film 4. Further, the metal separator 1 for a fuel cell according to the invention may be a so-called flat-plate separator where no gas flow path is formed. In use of such a flat-plate separator, the flat-plate metal substrate 2 with the flat surface, that is, without the above-mentioned gas flow path may be used.

In forming such gas flow paths, the gas flow paths can be formed by processing at least a part of the surface in a concave shape (in the form of recess) by the known press working, cutting process, etching process, or the like. In this way, the recessed portions allow gas to flow therethrough in assembling the fuel cell. The gas flow path may have any other shape, which is not limited particularly.

The acid-resistant metal film 3 contains non-noble metal including one or more kinds of elements selected from the group consisting of Zr, Nb, and Ta.

Since Zr, Nb, and Ta are metal with excellent acid resistance, the acid-resistant metal film 3 made of one or more kinds of non-noble metals selected from the group consisting of Zr, Nb, and Ta is formed over the metal substrate 2, and thus can prevent the elution of metal from the metal substrate 2. Note that the non-noble metal used for the acid-resistant metal film 3 is not limited to Zr, Nb, and Ta, and any other non-noble metal with excellent acid resistance can be used. For example, a semiconductor Si or the like doped with Hf, Al, P, or the like can be used.

The thickness of the acid-resistant metal film 3 is preferably equal to or more than 5 nm. For the thickness of the acid-resistant metal film 3 of less than 5 nm, pinholes are apt to be formed in the acid-resistant metal film 3, which may cause elution of the metal from the metal substrate 2. The thickness of the acid-resistant metal film 3 is more preferably equal to or more than 7 nm. On the other hand, the upper limit of the thickness of the acid-resistant metal film 3 is not limited to a specific one, but the thickness of the film 3 is preferably equal to or less than 500 nm, more preferably equal to or less than 300 nm, and much more preferably less than 100 nm from the viewpoint of the time and cost required for a step S1 of depositing the acid-resistant metal film to be described later.

The conductive alloy film 4 contains one or more kinds of noble metals selected from the group consisting of Au and Pt, and one or more kinds of non-noble metals selected from the group consisting of Zr, Nb, and Ta, over the above acid-resistant metal film 3.

Au and Pt are superior in acid resistance, and are ones among metal elements generally called noble metal which do not form an oxide film on the respective surfaces thereof in an oxidation environment, so that Au and Pt can maintain the good electrical conductivity even in the oxidation environment. It is noted that the noble metal used in the conductive alloy film 4 is not limited to Au and Pt in a fuel cell whose voltage (difference in voltage) is about 0.7 V or so, or in a fuel cell to be operated on such an operating condition, like a direct methanol fuel cell using methanol as fuel. Any other noble metal with excellent acid resistance which does not form an oxide film on its surface under the oxidation environment can be used. For example, Pd, Rh, Ru, and the like can be used.

The non-noble metal content (containing one or more kinds of elements selected from the group consisting of Zr, Nb, and Ta) of the conductive alloy film 4 is preferably in a range of 5 to 65 atomic percentage (atomic %). The noble metal is alloyed with the non-noble metal with the above composition to form the alloy film, so that the adhesion between the acid-resistant metal film 3 and the conductive alloy film 4 can be improved. Thus, the acid-resistant metal film 3 can be less prone to be peeled off from the conductive alloy film 4, which can maintain the electrical conductivity. The alloying of the noble metal of the conductive alloy film 4 with the non-noble metal with the above composition in use can reduce the amount of use of the expensive noble metal, and can also manufacture the conductive alloy film with adequate electrical conductivity and acid resistance at low cost.

For the non-noble metal content of less than 5 atomic % of the conductive alloy film 4, the conductive alloy film 4 may be peeled off when exposed to the acid environment for a long time due to the poor adhesion between the conductive alloy film 4 and the acid-resistant metal film 3. For the non-noble metal content of more than 65 atomic % of the conductive alloy film 4, a passivation film of the non-noble metal is formed on the surface of the film 4, resulting in reduced electrical conductivity. The non-noble metal content of the conductive alloy film 4 is more preferably in the range of 15 to 55 atomic %, and much more preferably 25 to 45 atomic %.

Such a conductive alloy film 4 preferably has a thickness of 2 nm or more. For the thickness of the conductive alloy film 4 of less than 2 nm, the passivation film is formed between the conductive alloy film 4 and the acid-resistant metal film 3, and thus the conductive alloy film 4 is peeled off to increase the contact resistance. A thickness of the conductive alloy film 4 is preferably equal to or more than 5 nm, and more preferably 7 nm. In contrast, the upper limit of the film thickness of the conductive alloy film 4 is not limited to a specific one, but the thickness of the conductive alloy film is preferably equal to or less than 500 nm from the viewpoint of the time and cost required for the step S2 of depositing the conductive alloy film to be described later.

The metal separator 1 for a fuel cell according to the invention as described above includes the acid-resistant metal film 3 with excellent acid resistance on the metal substrate 2, and further the conductive alloy film 4 with excellent acid resistance and which does not form an oxide film under an oxidation environment. Thus, the metal separator 1 can have excellent acid resistance and low contact resistance.

Such a metal separator 1 for a fuel cell can be suitably manufactured by a manufacturing method of the metal separator for a fuel cell to be described later.

Figure 2:
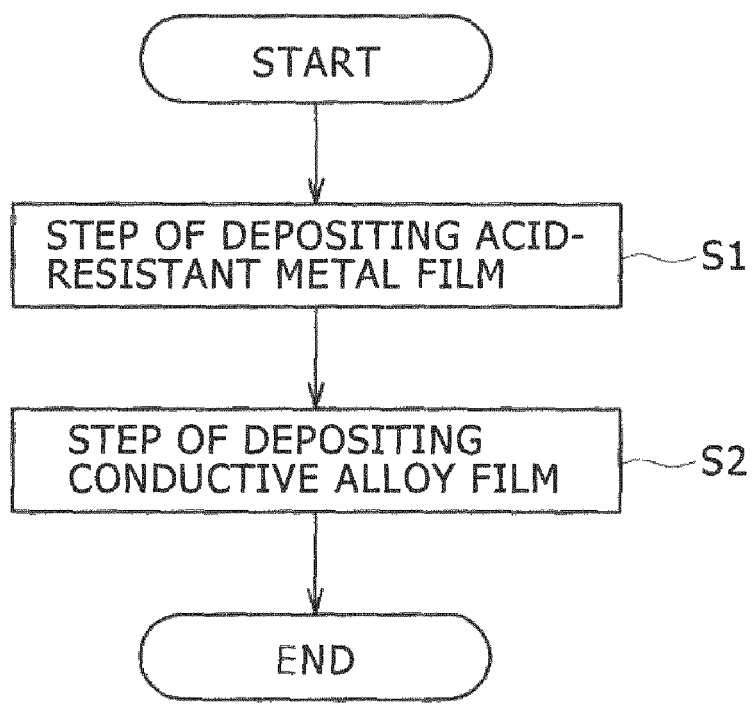
FIG. 2 is a flow chart showing a flow of a manufacturing method of the metal separator for a fuel cell according to the invention.

Now, the manufacturing method of the metal separator for a fuel cell according to the invention will be described with reference to FIG. 2 as necessary. FIG. 2 is a flowchart showing a flow of the manufacturing method of the metal separator 1 for a fuel cell according to the invention.

As shown in FIG. 2, the manufacturing method of the metal separator for a fuel cell according to the invention is a method for manufacturing a metal separator for a fuel cell by use of the metal substrate 2 with a flat surface, or with concave gas flow paths formed on at least a part of the surface. The manufacturing method includes a step S1 of depositing an acid-resistant metal film, and a step S2 of depositing a conductive alloy film.

In the step S1 of depositing the acid-resistant metal film, the acid-resistant metal film 3 containing one or more kinds of non-noble metals selected from the group consisting of Zr, Nb, and Ta is formed over the metal substrate 2 by a physical vapor deposition (PVD) method in which plasma is generated during a deposition process. The reason for depositing the metal film using one or more kinds of non-noble metals selected from the group consisting of Zr, Nb, and Ta, and the reason why the acid-resistant metal film 3 is preferably deposited so as to have a thickness of 5 nm or more have been described above, and a description thereof will be omitted.

Any one of Zr, Nb, and Ta which are acid-resistant metal is a metal having a high melting point. The acid-resistant metal film is deposited by a deposition method, such as a vacuum deposition method, which is a PVD method not generating plasma. At this time, when particles (atoms or ions, note that the same goes for the following description) coming to the metal substrate are attached to the metal substrate surface to form crystals so as to deposit the acid-resistant metal film, the particles are less prone to diffusion into the surface of the metal substrate. The film deposited becomes a porous film to generate pinholes. Thus, for example, in immersing the acid-resistant metal film deposited on the metal substrate into an acid solution, the acid solution penetrates the film through the pinholes to cause elution of metal of the metal substrate. That is, in order to prevent the elution of metal of the metal substrate, it is necessary to eliminate the formation of pinholes in the acid-resistant metal film. Thus, the formation of the dense acid-resistant metal film without pinholes needs to deposit the metal film by an ion plating method or a sputtering method, which is the PVD method generating plasma. As such a sputtering method, an unbalanced magnetron sputtering (UBMS) is more suitably used.

In step S1 of depositing the acid-resistant metal film, the acid-resistant metal film 3 is deposited on the metal substrate 2 by applying a voltage thereto, while heating the metal substrate 2. The deposition conditions at this time are preferably as follows: a heating condition of the metal substrate 2 of 50° C. or more, and a voltage application condition to the metal substrate 2 of −50 V or less. The PVD method satisfying the heating condition and voltage application condition can activate surface diffusion by giving energy to Ta, Zr, and Nb particles, which can be easily moved on the surface of the metal substrate. Thus, the acid-resistant alloy film can be made dense, and the pinholes can be eliminated. That is, heating of the metal substrate 2 gives thermal energy to the Ta, Zr, and Nb particles attached on the surface of the metal substrate thereby to increase kinetic energy of the Ta, Zr, and Nb particles, activating the surface diffusion.

When the heating condition of the metal substrate 2 in step S1 of depositing the acid-resistant metal film is a temperature of less than 50° C., or when the voltage application condition of the metal substrate 2 is a voltage of more than −50 V, the energy of sputtered particles diffused into the surface of the metal substrate 2 by being sputtered on the metal substrate 2 becomes lower. Then, a number of pinholes are formed in the acid-resistant metal film 3 (see FIG. 3(*a*) to be described later). The heating condition and voltage application condition of the metal substrate 2 are more preferably at a temperature of 100° C. or more, and at a voltage of −100 V or less, and further preferably at a heating temperature of 200° C. or more, and at a voltage of −200 V or less.

The Zr, Nb, and Ta elements to be used for the acid resistant metal film 3 are deposited by the sputtering (that is, on sputtering conditions not generating plasma) on deposition conditions generally employed, without applying any voltage to the metal substrate 2 and without heating. In this case, as shown in FIG. 3(*a*), pinholes are formed in the acid-resistant metal film on the metal substrate.

However, in step S1 of depositing the acid-resistant metal film, the metal substrate 2 is heated at a temperature of 50° C. or more, and a voltage of −50V or less is applied to the substrate 2 thereby to accelerate the surface diffusion of sputtered particles, which can form the dense and uniform acid-resistant metal film 3 without any pinholes as shown in FIG. 3(*b*). FIG. 3(*a*) shows a transmission electron microscope (TEM) image (under a magnification of 75000×) taken, by use of a TEM, of a section of the acid-resistant metal film deposited on deposition conditions conventionally used, that is, without heating the metal substrate made of pure titanium with no voltage applied thereto. FIG. 3(*b*) shows another TEM image (under a magnification of 75000×) taken by the TEM of a section of the acid-resistant metal film deposited on the metal substrate made of pure titanium when performing step S1 of depositing the acid-resistant metal film satisfying the above conditions. In both of FIGS. 3(*a*) and 3(*b*), a scale bar in each photograph indicates 200 nm.

The acid-resistant metal film shown in FIGS. 3(*a*) and 3(*b*) were deposited on the deposition conditions shown in the following Table 1.

TABLE 1

Figure 3A:
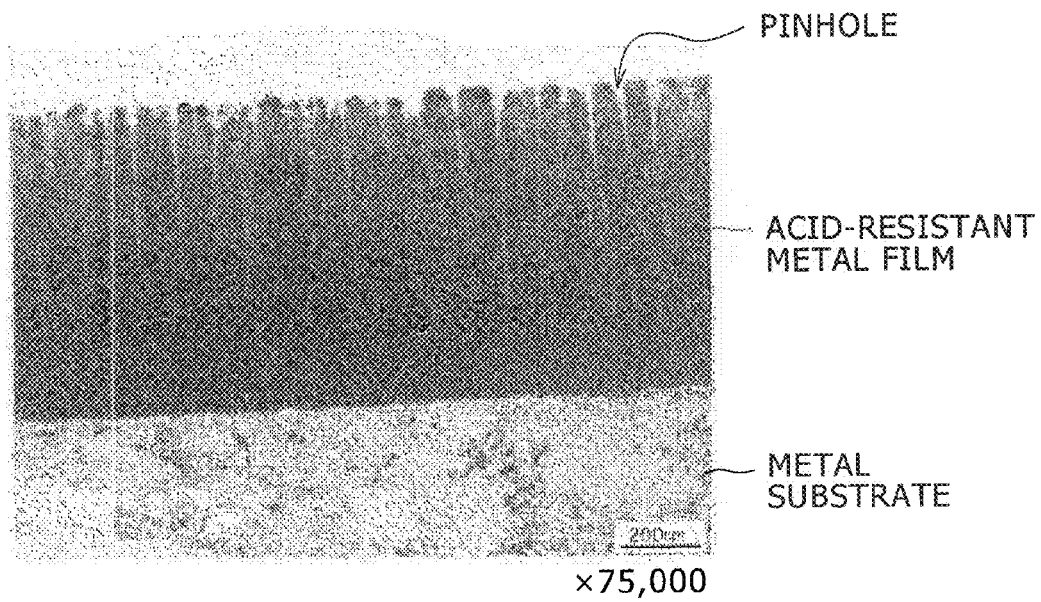
FIG. 3(a) shows a scanning microscope image taken of a Ta film deposited on a metal substrate by a sputtering method on deposition conditions generally used.
Figure 3B:
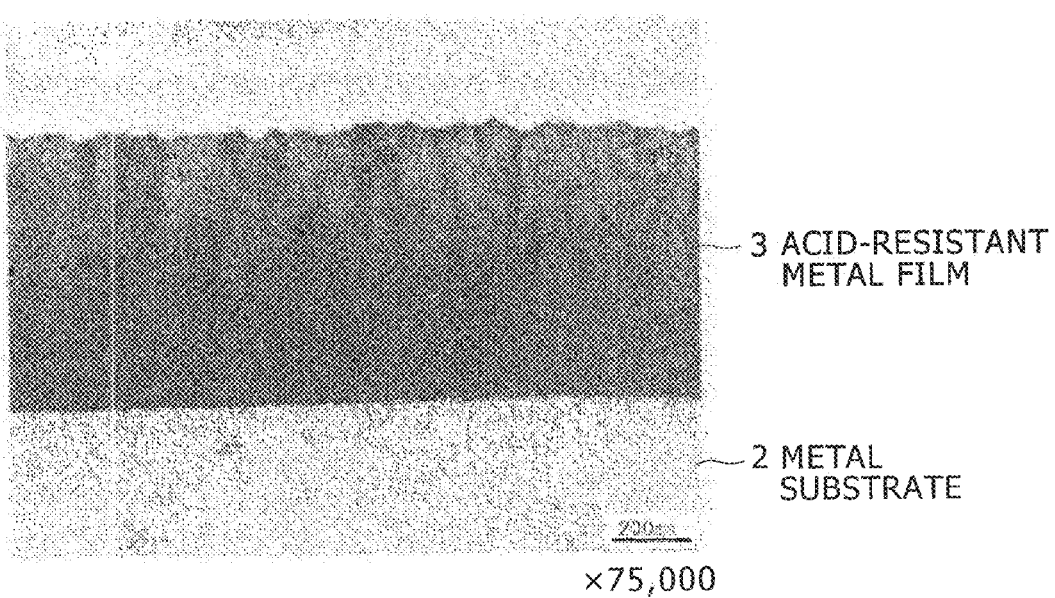
FIG. 3(b) shows another scanning microscope image taken of a Ta film deposited on the metal substrate by the sputtering method on specific deposition conditions defined by the invention.

|  | Deposition conditions for acid-resistant metal film shown in FIG. 3(a) | Deposition conditions for acid-resistant metal film shown in FIG. 3(b) |
|---|---|---|
| Back pressure | $2 \times 10^{-3}$ Pa or less | $2 \times 10^{-3}$ Pa or less |
| Target | Ta (Diameter 6 inches × thickness 6 mm) | Ta (Diameter 6 inches × thickness 6 mm) |
| Argon gas pressure in deposition | 0.6 Pa | 0.6 Pa |
| Sputtering power | 0.5 kW | 0.5 kW |
| Heating conditions of metal substrate | — | 460° C. |
| Voltage application conditions of a metal substrate | — | −50 V |

As shown in FIG. 3(*a*), it is shown that in the acid-resistant metal film deposited on the deposition conditions conventionally used, Ta crystals grow in a columnar shape from a metal substrate, and a number of pinholes are formed at a crystalline interface.

In contrast, as shown in FIG. 3(*b*), it is shown that in the acid-resistant metal film deposited in step S1 of depositing the acid-resistant metal film satisfying the above conditions, Ta crystals are densely formed and no pinhole is formed at a crystalline interface.

After immersing these specimens into 1M sulfuric acid aqueous solution for one hundred hours at 80° C., a decrease in weight, that is, the amount of dissolution of the metal substrate having the acid resistant metal film deposited thereon as shown in FIG. 3(*a*) are measured, and then determined to be 0.04 mg/cm². In contrast, there seems no decrease in weight of the metal substrate having the acid-resistant metal film deposited thereon as shown in FIG. 3(*b*). This shows that the acid-resistant metal film formed in step S1 of depositing an acid-resistant metal film according to the invention has excellent acid resistance.

Then, in step S2 of depositing a conductive alloy film, the conductive alloy film 4 containing one or more kinds of noble metals selected from the group consisting of Au and Pt, and one or more kinds of non-noble metals selected from the group consisting of Zr, Nb, and Ta is deposited on the acid-resistant metal film 3 by the PVD method.

The reason for depositing the metal film using one or more kinds of noble metals selected from the group consisting of Au and Pt, and one or more kinds of non-noble metals selected from the group consisting of Zr, Nb, and Ta, and the reason why the conductive alloy film 4 is preferably deposited so as to have a thickness of 2 nm or more have been described above, and a description thereof will be omitted.

The deposition of the conductive alloy film 4 is more preferably performing by sputtering because the sputtering can deposit an alloyed film and can also easily control the composition.

According to a manufacturing method of a metal separator for a fuel cell of the invention as described above, the dense acid-resistant metal film 3 is uniformly formed on the metal substrate 2, and the conductive alloy film 4 with excellent acid resistance and contact resistance is deposited on the film 3, which can manufacture the metal separator 1 for a fuel cell with excellent acid resistance and low contact resistance.

EXAMPLES

Now, the metal separator for a fuel cell and the manufacturing method thereof according to the invention will be specifically described with reference to Examples satisfying the requirements of the invention, and Comparative Examples not satisfying the requirements of the invention.

Example A

Specimens were made by preparing eighteen sheets of metal substrate (2 cm×5 cm×1 mm) made of commercially pure titanium (JIS class-1) defined by JIS H 4600, and by performing ultrasonic cleaning on the substrates with acetone. A deposition process was performed by unbalanced magnetron sputtering (UBMS) on the conditions shown in Table 2 below. Deposition equipment in use was an UBMS 202 device (manufactured by Kobe Steel, Ltd.).

TABLE 2

| Back pressure (Pa) | $2 \times 10^{-3}$ |
|---|---|
| Output applied to target (W) | Acid-resistant metal film: 500 |
|  | Conductive alloy film: 200 |
| Ar gas pressure (Pa) | 0.6 |
| Heating temperature of metal substrate (° C.) | 400 |
| Bias applied to metal substrate (V) | −200 |

As shown in Table 3 below, any one of Zr, Nb, and Ta was attached in use to a negative electrode in a chamber as a target for the acid-resistant metal film. A material including a base of Au or Pt and a chip of Zr, Nb, or Ta attached thereto in a predetermined amount was attached to the other electrode in the chamber, and used as a target for the conductive alloy film. FIG. 4 is an explanatory diagram showing the structure of deposition equipment. Deposition was performed on both surfaces and sides of a specimen by causing the specimen to revolve about a fixed stand, and further to rotate on its axis.

Table 3 shows a noble metal element and a non-noble metal element used in a conductive alloy film of each of specimens 1 to 18, a content (%) and thickness (nm) of a non-noble metal of the conductive alloy film, and a non-noble metal element and thickness of an acid-resistant metal film.

TABLE 3

| Specimen | Conductive alloy film | | | | Acid-resistant metal film | |
|---|---|---|---|---|---|---|
| | Noble metal element | Non-noble metal element | Non-noble metal content (atomic %) | Thickness (nm) | Non-noble metal element | Thickness (nm) |
| 1 | Au | Ta | 35 | 20 | Ta | 10 |
| 2 | Au | Ta | 20 | 15 | Ta | 10 |
| 3 | Au | Ta | 40 | 10 | Ta | 7 |
| 4 | Au | Ta | 60 | 8 | Ta | 50 |
| 5 | Au | Ta | 85 | 10 | Ta | 30 |
| 6 | Au | Ta | 2 | 10 | Ta | 30 |
| 7 | Au | Ta | 35 | 10 | Ta | 3 |
| 8 | Au | Ta | 35 | 1 | Ta | 20 |
| 9 | Pt | Ta | 40 | 10 | Ta | 7 |
| 10 | Pt | Ta | 50 | 8 | Ta | 50 |
| 11 | Pt | Ta | 2 | 20 | Ta | 20 |
| 12 | Pt | Ta | 90 | 10 | Ta | 50 |
| 13 | Au | Zr | 50 | 10 | Zr | 7 |
| 14 | Au | Nb | 60 | 8 | Nb | 50 |
| 15 | Au | Zr | 35 | 1 | Zr | 20 |
| 16 | Au | Nb | 35 | 10 | Nb | 3 |
| 17 | Au | Zr | 60 | 10 | Ta | 20 |
| 18 | Au | Ta | 90 | 10 | Nb | 50 |

In Table 3, the non-noble metal content (atomic %) of the conductive alloy film was measured by an inductively coupled plasma (ICP) spectrometry. The ICP spectrometry was carried out by manufacturing a specimen with a conductive alloy film previously deposited thereon, immersing the specimen into an acid solution (a mixture of aqua regia and hydrofluoric acid) being capable of dissolving therein both of the titanium substrate and the conductive alloy film, and measuring the concentrations of noble metal element and non-noble metal element constituting the conductive alloy film. Based on the result, the composition ratio (atomic %) is shown. The mixture of aqua regia and hydrofluoric acid was prepared so as to have a volume ratio of hydrochloric acid: nitric acid:(hydrofluoric acid+distilled water)=3:1:(2+6) by use of acid solutions with the following solution concentrations: hydrochloric acid with a 38% concentration, nitric acid with a 70% concentration, and hydrofluoric acid with a 48 concentration.

The thicknesses of the conductive alloy film and the acid-resistant metal film shown were those estimated from respective values calculated from a sputtering rate for each target used.

Figure 5:
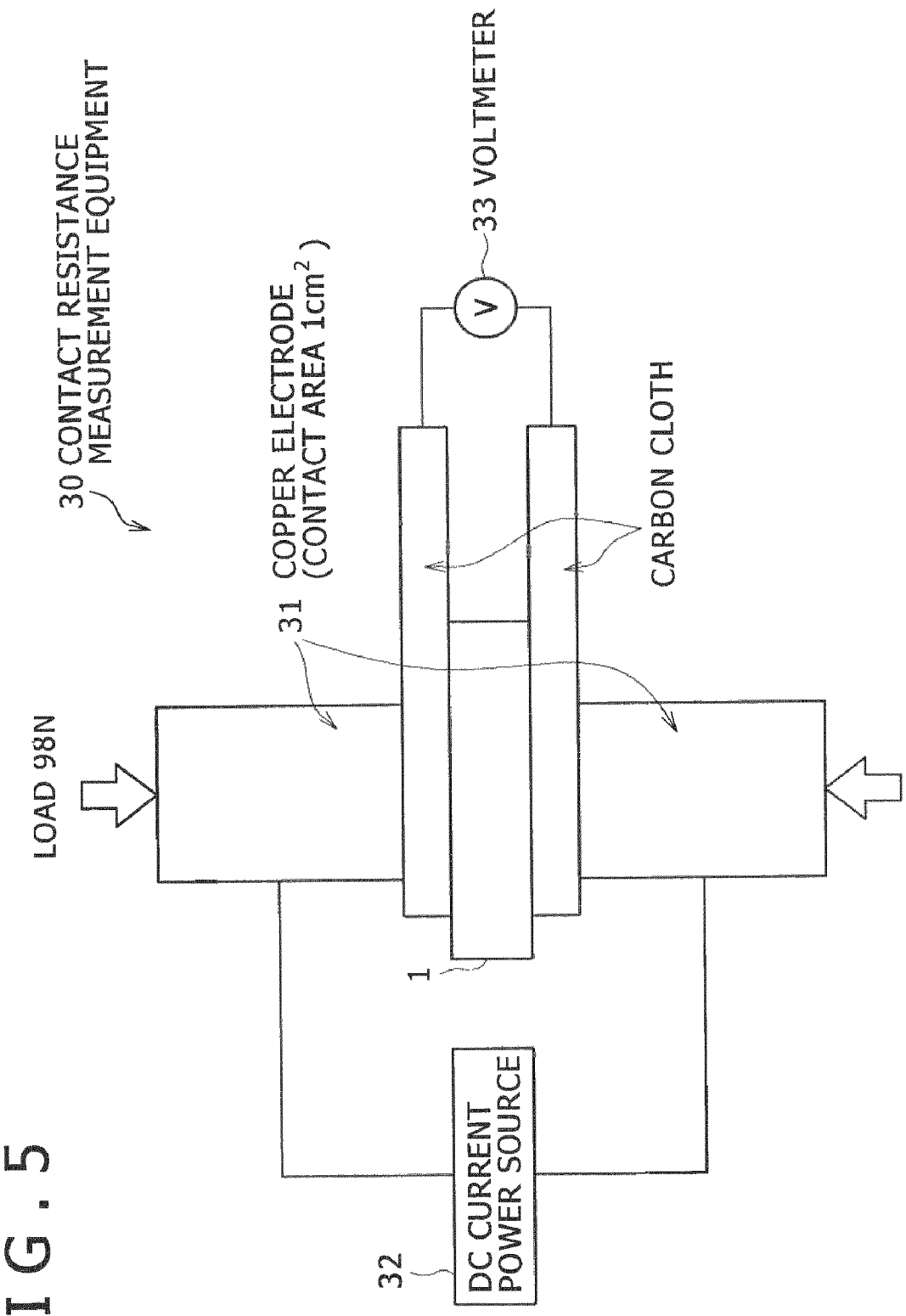
FIG. 5 is an explanatory diagram for explaining a measuring method of a contact resistance.

A load of 98N (10 kgf) was applied to each of the specimens 1 to 18 shown in Table 3 to measure each contact resistance thereof using contact resistance measurement equipment 30 shown in FIG. 5. That is, carbon cloths C and C held both sides of each specimens 1 to 18. Further, a pressure of 98N was applied to the outer sides of the carbon cloth C using copper electrodes 31 and 31 at a contact area of 1 cm$^2$, and 1 A of current was allowed to pass through the specimen using a DC power source 32. The voltage applied to between the carbon cloths C and C was measured by a voltmeter 33, and respective resistances were calculated.

An acid-resistance test was performed on each of the specimens 1 to 18. At this time, in order to expose only a part of 1 cm×1 cm at the center of each side of the metal substrate, the specimens 1 to 18 were masked except for the above part of 1 cm×1 cm. Each specimen was immersed in a sulfuric acid solution (0.5 mol/l) at 80° C. for one hundred hours, cleaned, and dried to remove a masking material. Then, a decrease in weight of the specimen was measured using a microbalance capable of measuring up to 1 μg, and thereafter a contact resistance of the specimen was measured using contact resistance measurement equipment 30 in the same way as described above. The specimen having a contact resistance of 15 mΩ·cm$^2$ or less after the heat treatment and the immersion in the sulfuric acid was determined to be acceptable. The decrease in weight of 0.02 mg/cm$^2$ or less after the immersion in the sulfuric acid was determined to be acceptable.

The following Table 4 shows the contact resistance (mΩ·cm$^2$) after the immersion in sulfuric acid, and the decrease in weight (mg/cm$^2$) after the immersion in sulfuric acid of the specimens 1 to 18.

TABLE 4

| Specimen | Contact resistance after immersion in sulfuric acid (mΩ·cm$^2$) | Decrease in weight after immersion in sulfuric acid (mg/cm$^2$) | Note |
|---|---|---|---|
| 1 | 4.0 | 0 | Example |
| 2 | 6.8 | 0 | Example |
| 3 | 4.2 | 0 | Example |
| 4 | 9.3 | 0 | Example |
| 5 | 50.2 | 0 | Comparative Example |
| 6 | 98.9 | 0.02 | Comparative Example |
| 7 | 125.1 | 0.12 | Comparative Example |
| 8 | 80.5 | 0 | Comparative Example |
| 9 | 10.2 | 0 | Example |
| 10 | 9.3 | 0 | Example |
| 11 | 97.6 | 0.01 | Comparative Example |
| 12 | 72.2 | 0 | Comparative Example |
| 13 | 7.7 | 0.01 | Example |
| 14 | 12.1 | 0.01 | Example |
| 15 | 50.7 | 0.01 | Comparative Example |
| 16 | 196.1 | 0.37 | Comparative Example |
| 17 | 8.2 | 0 | Example |
| 18 | 272.0 | 0.02 | Comparative Example |

As shown in Table 4, in the specimens 1 to 4, 9, 10, 13, 14 and 17, the noble metal element and the non-noble metal element used in the conductive alloy film, the content (atomic %) and thickness (nm) of the non-noble metal of the conductive alloy film, and the non-noble metal element and thickness of the acid-resistant metal film satisfied the requirements of the invention. Therefore, in the specimens 1 to 4, 9, 10, 13, 14, and 17, the results of the contact resistance after the immersion in sulfuric acid and of the decrease in weight after the immersion in sulfuric acid were determined to be acceptable (in Examples (see the "note" column in Table 4).

On the other hand, in the specimens 6 and 11, the non-noble metal content of the conductive alloy film was low, which made the adhesion between the conductive alloy film and the acid-resistant metal film worse, causing the conductive alloy film to be peeled off. Further, a passivation film was formed at the acid-resistant metal film, which leaded to an increase in contact resistance.

In the specimens 5, 12, and 18, since the non-noble metal content of the conductive alloy film was large, the passivation film was formed on the surface of the acid-resistant metal film, which resulted in an increased contact resistance. Thus, the specimens 5, 12, and 18 were determined not to be acceptable (in Comparative Examples (see "note" column in Table 4)).

In the specimens 7 and 16, the acid-resistant metal film was thin, so that pinholes were formed in the acid-resistant metal film. Thus, the exposed part of the metal substrate was increased in the specimens 7 and 16, leading to the decrease in weight of the specimen after the immersion in sulfuric acid. Further, the formation of the oxide film on the surface of the metal substrate increased the contact resistance. Accordingly, the specimens 7 and 16 were determined not to be acceptable (in Comparative Examples (see "note" column in Table 4)).

In the specimens 8 and 15, the conductive alloy film was thin, so that the passivation film was formed between the conductive alloy film and the acid-resistant metal film, and this part was then peeled off, which increased the contact resistance. Thus, the specimens 8 and 15 were determined not to be acceptable (in Comparative Examples (see "note" column in Table 4)).

A cross-cut tape peeling test was carried out according to JIS K 5400 by putting a tape on the surface of the specimen 1 as Example of the invention. As a result, the peeling of the acid-resistant metal film and the conductive alloy film was not ascertained.

Example B

Six sheets of metal substrate made of commercially pure titanium under the same standard as in Example A were prepared. On heating conditions and voltage application conditions of the metal substrate shown in Table 5 below, deposition was performed in the following way. A composition of the conductive alloy film was set to Au—Ta with the Ta content being 45 atomic %, and a thickness of the conductive alloy film was set to 20 nm. And, a composition of the acid-resistant metal film was set to Ta, and a thickness of the acid-resistant metal film was also set to 10 nm. Thus, the specimens 19 to 24 were manufactured.

TABLE 5

| Specimen | Heating condition of metal substrate (° C.) | Voltage application condition of metal substrate (V) |
|---|---|---|
| 19 | 400 | −80 |
| 20 | 200 | −100 |
| 21 | 150 | −200 |
| 22 | No heating | No application |
| 23 | 400 | −10 |
| 24 | 20 | −200 |

The contact resistance (mΩ·cm$^2$) after the immersion in sulfuric acid and the decrease in weight (mg/cm$^2$) after the immersion in sulfuric acid were evaluated under the same conditions as those of Example A on the specimens 19 to 24 manufactured on the conditions described in Table 5. The results are shown in Table 6 below.

TABLE 6

| Specimen | Contact resistance after immersion in sulfuric acid (mΩ · cm$^2$) | Decrease in weight after immersion in sulfuric acid (mg/cm$^2$) | Note |
|---|---|---|---|
| 19 | 6.6 | 0 | Example |
| 20 | 6.4 | 0 | Example |
| 21 | 5.8 | 0 | Example |
| 22 | 85.2 | 0.4 | Comparative Example |
| 23 | 20.7 | 0.08 | Comparative Example |
| 24 | 18.7 | 0.04 | Comparative Example |

In the specimens 19 to 21, the heating condition of the metal substrate was a temperature of 50° C. or more, and the voltage application condition of the metal substrate was a voltage of less than −50 V. The results of the contact resistances and decrease in weight of the specimens 19 to 21 after the immersion in sulfuric acid were determined to be acceptable. Thus, the specimens 19 to 21 are defined as Examples (see the "note" column in Table 6).

On the other hand, in the specimens 22 to 24, since the heating condition of the metal substrate was a temperature of less than 50° C., or since the voltage application condition of the metal substrate was a voltage of more than −50 V, pinholes were formed in the acid-resistant metal film. Thus, a part of the metal substrate was exposed to an acid environment, so that metal of the metal substrate was eluted from the substrate. As a result, the weight after immersion in sulfuric acid was decreased, and the contact resistance after immersion in sulfuric acid was increased. Thus, the specimens 22 to 24 were determined not to be acceptable (in Comparative Examples (see the "note" column in Table 6)).

The metal separator for a fuel cell and a manufacturing method thereof according to the invention have been described more specifically with reference to the preferred embodiments and Examples for carrying out the invention. However, the scope of the invention is not limited to the above description, and should be widely understood based on the scope of claim for patent. Further, based on the above description, it will be obvious that various changes and modifications can be made therein without departing from the scope of the invention.

The present application is based on the disclosure of Japanese Patent Application No. 2007-102053 filed on Apr. 9, 2007, the contents of which are incorporated herein by reference in its entirety.

What is claimed is:

1. A metal separator for a fuel cell, comprising:
   a metal substrate comprising a flat surface or a concave gas flow path on at least a part of the flat surface;
   an acid-resistant metal film over the surface of the metal substrate, wherein the acid-resistant metal film comprises at least one non-noble metal selected from the group consisting of Zr, Nb, and Ta; and
   a conductive alloy film over the acid-resistant metal film, wherein the conductive alloy film comprises (i) at least one noble metal selected from the group consisting of Au and Pt, and (ii) at least one non-noble metal selected from the group consisting of Zr, Nb, and Ta,
   wherein the at least one non-noble metal in the conductive alloy film is alloyed with the at least one noble metal in the conductive alloy film.

2. The metal separator of claim 1, wherein a non-noble metal content of the conductive alloy film is from 5 to 65 atomic %.

3. The metal separator of claim 1, wherein the conductive alloy film has a thickness of 2 nm or more.

4. The metal separator of claim 1, wherein the acid-resistant metal film has a thickness of 5 nm or more.

5. The metal separator of claim 1, wherein the metal substrate is a metal material selected from the group consisting of pure titanium, a titanium alloy, a stainless steel, pure aluminum, an aluminum alloy, pure copper, and a copper alloy.

6. A method for manufacturing the metal separator of claim 1, the method comprising:
   depositing an acid-resistant metal film by a physical vapor deposition (PVD) method on a surface of a metal substrate, wherein the acid-resistant metal film comprises at least one non-noble metal selected from the group consisting of Zr, Nb, and Ta; and depositing a conductive alloy film by the PVD method on the acid-resistant metal film, wherein the conductive alloy film comprises (i) at least one noble metal selected from the group consisting of Au and Pt, and (ii) at least one non-noble metal selected from the group consisting of Zr, Nb, and Ta, wherein depositing the acid-resistant metal film comprises applying a voltage to the metal substrate while heating the metal substrate.

7. The method of claim 6, wherein heating the metal substrate comprises heating to a temperature of 50° C. or more, and applying the voltage to the metal substrate comprises applying a voltage of −50 V or less.

8. The method of claim 6, wherein depositing the conductive alloy film comprises depositing the conductive alloy film to a thickness of equal to or more than 2 nm.

9. The method of claim 6, wherein depositing the acid-resistant metal film comprises depositing the acid-resistant metal film to a thickness of equal to or more than 5 nm.

10. The method of claim 6, wherein the PVD method is an ion plating method or a sputtering method.

11. The method of claim 6, wherein the metal substrate is of a metal material selected from the group consisting of pure titanium, a titanium alloy, a stainless steel, pure aluminum, an aluminum alloy, pure copper, and a copper alloy.

12. The metal separator of claim 1, wherein the acid-resistant metal film comprises Zr.

13. The metal separator of claim 1, wherein the acid-resistant metal film comprises Nb.

14. The metal separator of claim 1, wherein the acid-resistant metal film comprises Ta.

15. The metal separator of claim 1, wherein the conductive alloy film comprises Zr.

16. The metal separator of claim 1, wherein the conductive alloy film comprises Nb.

17. The metal separator of claim 1, wherein the conductive alloy film comprises Ta.

18. The metal separator of claim 1, wherein the acid-resistant metal film has a thickness of from 5 nm to 100 nm.

19. The metal separator of claim 1, wherein the metal substrate is a metal material selected from the group consisting of pure titanium, a titanium alloy, pure aluminum, an aluminum alloy, pure copper, and a copper alloy.

20. The metal separator of claim 1, wherein the metal substrate is of pure aluminum or an aluminum alloy.

\* \* \* \* \*